United States Patent
Agarwal et al.

(10) Patent No.: US 11,830,817 B2
(45) Date of Patent: Nov. 28, 2023

(54) CREATING INTERCONNECTS BETWEEN DIES USING A CROSS-OVER DIE AND THROUGH-DIE VIAS

(71) Applicants: ADVANCED MICRO DEVICES, INC., Santa Clara, CA (US); ATI TECHNOLOGIES ULC, Markham (CA)

(72) Inventors: Rahul Agarwal, Santa Clara, CA (US); Raja Swaminathan, Austin, TX (US); Michael S. Alfano, Austin, TX (US); Gabriel H. Loh, Bellevue, WA (US); Alan D. Smith, Austin, TX (US); Gabriel Wong, Markham (CA); Michael Mantor, Orlando, FL (US)

(73) Assignees: ADVANCED MICRO DEVICES, INC., Santa Clara, CA (US); ATI TECHNOLOGIES ULC, Markham (CA)

(*) Notice: Subject to any disclaimer, the term of this patent is extended or adjusted under 35 U.S.C. 154(b) by 0 days.

(21) Appl. No.: 17/085,215

(22) Filed: Oct. 30, 2020

(65) Prior Publication Data
US 2022/0051985 A1 Feb. 17, 2022

Related U.S. Application Data

(60) Provisional application No. 63/064,759, filed on Aug. 12, 2020.

(51) Int. Cl.
| | |
|---|---|
| *H01L 23/538* | (2006.01) |
| *H01L 25/065* | (2023.01) |
| *H01L 21/50* | (2006.01) |
| *H01L 27/06* | (2006.01) |

(52) U.S. Cl.
CPC ......... *H01L 23/5384* (2013.01); *H01L 21/50* (2013.01); *H01L 23/5381* (2013.01); *H01L 23/5385* (2013.01); *H01L 25/0657* (2013.01); *H01L 27/0688* (2013.01)

(58) Field of Classification Search
CPC ............ H01L 23/5384; H01L 23/5381; H01L 23/5385; H01L 21/50; H01L 25/0657; H01L 25/0652; H01L 27/0688
See application file for complete search history.

(56) References Cited

U.S. PATENT DOCUMENTS

| | | | |
|---|---|---|---|
| 9,941,253 B1* | 4/2018 | Jung | H01L 25/50 |
| 2009/0321939 A1* | 12/2009 | Chandrasekaran | H01L 25/0655 257/774 |
| 2013/0187292 A1 | 7/2013 | Semmelmeyer et al. | |
| 2018/0138146 A1* | 5/2018 | Cheah | H01L 24/33 |
| 2019/0181118 A1* | 6/2019 | Chew | H01L 23/5384 |
| 2019/0385977 A1 | 12/2019 | Elsherbini et al. | |
| 2020/0211970 A1* | 7/2020 | Gomes | H01L 25/0655 |
| 2020/0273799 A1* | 8/2020 | Sung | H01L 24/32 |

(Continued)

OTHER PUBLICATIONS

International Search Report and Written Opinion, PCT/US2021/045734, dated Dec. 1, 2021, 11 pages.

*Primary Examiner* — Dao H Nguyen

(57) ABSTRACT

A semiconductor package includes a first die, a second die, and an interconnect die coupled to a first plurality of through-die vias in the first die and a second plurality of through-die vias in the second die. The interconnect die provides communications pathways the first die and the second die.

20 Claims, 7 Drawing Sheets

(56) References Cited

U.S. PATENT DOCUMENTS

| | | | |
|---|---|---|---|
| 2020/0395309 A1* | 12/2020 | Cheah | H01L 23/5389 |
| 2021/0028152 A1* | 1/2021 | Lee | H01L 25/50 |
| 2021/0159211 A1* | 5/2021 | Rubin | H01L 24/05 |
| 2021/0193616 A1* | 6/2021 | Cheah | H01L 25/16 |

* cited by examiner

Stack An Interconnect Die Face-Down On Respective Back Surfaces Of A First Die And A Second Die 510

Bond The Interconnect Die To A First Plurality Of Through-Chip Vias In The First Die And A Second Plurality Of Through-Chip Vias In The Second Die 520

Remove A Portion The Back Of The First Die And The Second Die To Expose The First Plurality Of Through-Chip Vias And The Second Plurality Of Through-Chip Vias 610

Stack An Interconnect Die Face-Down On Respective Back Surfaces Of A First Die And A Second Die 510

Bond The Interconnect Die To A First Plurality Of Through-Chip Vias In The First Die And A Second Plurality Of Through-Chip Vias In The Second Die 520

FIG. 5

Stack An Interconnect Die Face-Down On Respective Back Surfaces Of A First Die And A Second Die 510

Stack A Third Die Face-Down On The Back Surface Of The First Die 710

Bond The Interconnect Die To A First Plurality Of Through-Chip Vias In The First Die And A Second Plurality Of Through-Chip Vias In The Second Die 520

Bond The Third Die To A Third Plurality Of Through-Chip Vias In The First Die 720

FIG. 6

CREATING INTERCONNECTS BETWEEN DIES USING A CROSS-OVER DIE AND THROUGH-DIE VIAS

CROSS-REFERENCE TO RELATED APPLICATION

This application claims priority to U.S. Provisional Patent Application No. 63/064,759, filed Aug. 12, 2020, which is hereby incorporated by reference in its entirety.

BACKGROUND

A System-on-a-Chip (SoC) integrates multiple blocks of functionality in a single integrated circuit. For example, an SoC may include one or more processor cores, memory interfaces, network interfaces, optical interfaces, digital signal processors, graphics processors, telecommunications components, and the like. Traditionally, each of the blocks are created in one a monolithic die. However, for various reasons, such as increasing the yield of functional chips or reducing design complexity and cost, it is increasingly more common to separate these blocks into individual die and reconstitute them in a package. To achieve the efficiency and performance of a monolithic die, these individual dies must be highly interconnected. As the sizes of dies shrink and/or the number of input/output pins increases, it is becoming increasingly difficult to scale this connectivity.

BRIEF DESCRIPTION OF THE DRAWINGS

FIG. 5 is a flowchart of an example method of creating interconnects between dies using a cross-over die and through-die vias according to some embodiments.

FIG. 6 is a flowchart of an example method of creating interconnects between dies using a cross-over die and through-die vias according to some embodiments.

DETAILED DESCRIPTION

Figure 1:
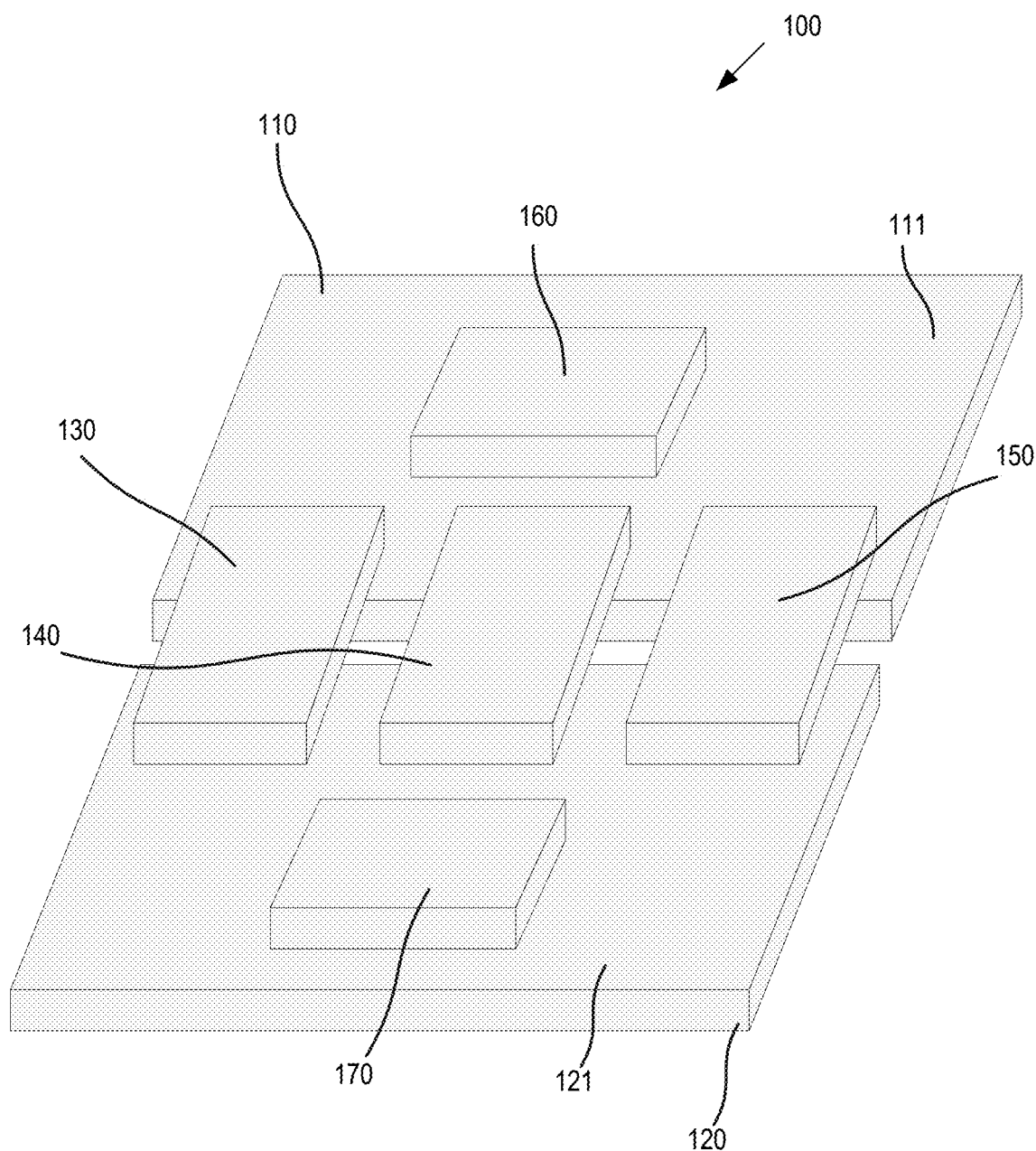
FIG. 1 sets forth a block diagram of an example semiconductor package architecture for creating interconnects between dies using a cross-over die and through-die vias according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" may be used herein to more easily identify various components, and may identify that those components are, for example, on opposing sides of another component. The spatially relative terms are intended to encompass different orientations of the device in use or operation in addition to the orientation depicted in the figures.

The construction of a semiconductor device such as a system-in-package (SiP) or system-on-integrated chip (SoIC) generally includes a die fabrication process and a packaging process. The fabrication process, typically performed in a clean room at a foundry, includes fabricating system-on-a-chip (SoC) dies that implement a component, or functional circuit block, of the system on a wafer. For example, each SoC die may include a component such as a processor core, interface, memory, graphical processing unit, digital signal processor, and the like. These components may be partitioned on the wafer. During the fabrication process, the device layers implementing the functional circuit blocks and the redistribution structures connecting those functional circuit blocks are created in a clean room with great precision. The wafer is then diced to create individual SoC dies (e.g., "chiplets"). During the packaging process, heterogenous SoC dies are integrated in a package to reconstitute or create the system. The SoC dies may be connected using various technologies, such as post-fabrication redistribution layers, interposer wafers, fan out structures, and the like. A goal is to increase the yield of known good dies, and create an integrated solution that performs as well or better than the monolithic SoC using these connection technologies. However, as the number of input/output (I/O) connections between individual dies increases, implementing these connections becomes challenging.

As semiconductor technologies further advance, stacked semiconductor devices (e.g., three dimensional integrated circuits (3DICs)), have emerged as an effective alternative to further reduce the physical size of semiconductor devices. In a stacked semiconductor device, active circuits such as logic, memory, processor circuits, and the like are fabricated on different semiconductor die. Two or more semiconductor dies may be installed or stacked on top of one another to further reduce the form factor of the semiconductor device.

One approach to SoC design and component reuse is the notion of a "chiplet." A "chiplet" is a semiconductor die containing one or more functional circuit blocks, or intellectual property (IP) blocks, that have been specifically designed to work with other chiplets to form larger more complex chips. To modularize system design and reduce complexity, these chiplets often include reusable IP blocks. The integration of various heterogenous chiplets in a single system can be challenging. For die-to-die partitioning, high density, short channel, wide interconnects are needed. While this can be achieved by using post-fabrication redistribution layer structures, more than 2-3 layers of fine line and space pitch is required for such connections, and conventional package or wafer level fanout integration solutions cannot deliver this target. Furthermore, the I/O connections coming out of dies are limited by bumping and flip chip technologies. For example, die last flip chip bonding and solder reflow for connections cannot scale further down, whereas die first solutions are limited by pick and place accuracy on a temporary carrier and via capture tolerances.

Embodiments in accordance with the present disclosure are directed to creating interconnects between dies using a cross-over die and through-die vias to provide connection densities for the integration of highly-partitioned SoC dies. In some examples an SoC is split into dies, or chiplets, based on functionality and optimized die sizes for better fabrication yield. In these examples, chips are configured so that some dies are placed side by side in 2D fashion and some dies are stacked on top of bottom dies. Ultra-high density I/O connections are needed between dies so that dies integrated in a heterogeneous fashion can act similar to or better than a monolithic device. The top dies are used to not only provide its core functionality but also act as bridge between bottom dies. Foundry die-level redistribution layers (e.g., back end of line (BEOL) layers) are utilized to create the bridging functionality of the interconnect dies, i.e., cross-over dies, that are attached to the backs of the bottom dies. Signals, power, and ground are delivered to the interconnect dies using through-die vias in the bottom dies. The interconnect die may be passive (just metal connections) or can include active functional circuit blocks of the SoC along with die-to-die connections.

An example embodiment in accordance with the present disclosure is directed to a semiconductor package including a first die, a second die, and an interconnect die coupled to a first plurality of through-die vias in the first die and a second plurality of through-die vias in the second die. In some implementations, the first die includes a first die pad region on a first surface of a first substrate, the first plurality of through-die vias connecting the first die pad region to a second surface of the first substrate and the second die includes a second die pad region on first a surface of a second substrate, the second plurality of through-die vias connecting the second die pad region to a second surface of the second substrate. In some implementations, a first plurality of die pads of the interconnect die is bonded to the first plurality of through-die vias and a second plurality of die pads of the interconnect die are bonded to the second plurality of through-die vias. In some implementations, the interconnect die is hybrid bonded to the first die and the second die. In some implementations, the first die, the second die, and the interconnect die are system-on-a-chip dies. In some implementations, the interconnect die includes fabricated redistribution layer structures that implement communication pathways between the first die and the second die. In some implementations, a third die is coupled to the first die using the first plurality of through-die vias and a fourth die is coupled to the second die using the second plurality of through-silicon vias.

Another embodiment in accordance with the present disclosure is directed to an apparatus including a component and a semiconductor package operatively connected to the component. In this embodiment, the semiconductor package includes a first die, a second die, and an interconnect die coupled to a first plurality of through-die vias in the first die and a second plurality of through-die vias in the second die. In some implementations, the first die includes a first die pad region on a first surface of a first substrate, the first plurality of through-die vias connecting the first die pad region to a second surface of the first substrate and the second die includes a second die pad region on first a surface of a second substrate, the second plurality of through-die vias connecting the second die pad region to a second surface of the second substrate. In some implementations, a first plurality of die pads of the interconnect die is bonded to the first plurality of through-die vias and a second plurality of die pads of the interconnect die are bonded to the second plurality of through-die vias. In some implementations, the interconnect die is hybrid bonded to the first die and the second die. In some implementations, the first die, the second die, and the interconnect die are system-on-a-chip dies. In some implementations, the interconnect die includes fabricated redistribution layer structures that implement communication pathways between the first die and the second die. In some implementations, a third die is coupled to the first die using the first plurality of through-die vias and a fourth die is coupled to the second die using the second plurality of through-silicon vias.

Yet another embodiment in accordance with the present disclosure is directed to a method of creating interconnects between dies using a cross-over die and through-die vias that includes stacking an interconnect die face-down on respective back surfaces of a first die and a second die and bonding the interconnect die to a first plurality of through-die vias in the first die and a second plurality of through-die vias in the second die. In some implementations, the method also includes, prior to stacking the interconnect die, removing a portion of the back of the first die and the second die to expose the first plurality of through-die vias and the second plurality of through-die vias. In some implementations, stacking an interconnect die face-down on respective back surfaces of a first die and a second die includes aligning a first plurality of die pads of the interconnect die with the first plurality of through-die vias and a second plurality of die pads of the interconnect die with the second plurality of die pads. In some implementations, the method also includes stacking a third die face-down on the back surface of the first die and bonding the third die to a third plurality of through-die vias in the first die. In some implementations, the first die, the second die, and the interconnect die are system-on-a-chip dies. In some implementations, the interconnect die includes fabricated redistribution layer structures that implement communication pathways between the first die and the second die.

For further explanation, FIG. 1 depicts a perspective view of an example package structure architecture (100) according to some embodiments. Embodiments of the package structure architecture (100) may be useful in high performance applications, such as, for example, a personal computer, a notebook, a tablet, a smart phone, a storage data center, or applications involving large scale databases and/or analytics, such as finance, life sciences, and/or artificial intelligence. Many other applications are possible. Additionally, package structure (100) may be assembled as described herein in a manner that, when compared to other methods of manufacturing such as system-in-package structures, is cost effective and provides higher manufacturing yields. Moreover, the connections between components in the package structure (100) and may have increased density, performance, and reliability compared to some other such system-in-package structures.

The example package structure depicted in FIG. 1 includes SoC dies (110, 120) that are bottom dies. In the view depicted in FIG. 1, the visible surfaces (111, 121) are the back surfaces of the dies (110, 120). Interconnect dies (130, 140, 150) are stacked on top of the back surface (111, 121) of the bottom dies (110, 120) in an overlapping configuration as shown. In various examples, the interconnect dies (130, 140, 150) may be also be SoC dies, or may be passive bridging dies. The interconnect dies (130, 140, 150) include a face (opposite the back surface and not visible) of a connectivity region (e.g., BEOL layers) that is bonded to the bottom dies (110, 120). The connectivity regions are coupled to through-silicon vias (not visible) in the bottom dies (110, 120), thereby providing communication pathways between the bottom dies (110, 120). In some examples, additional SoC dies (160, 170) are stacked on top of the bottom dies (110, 120). Connectivity regions of the top dies (160, 170) are coupled to additional through-silicon vias in the bottom dies (110, 120).

Figure 2:
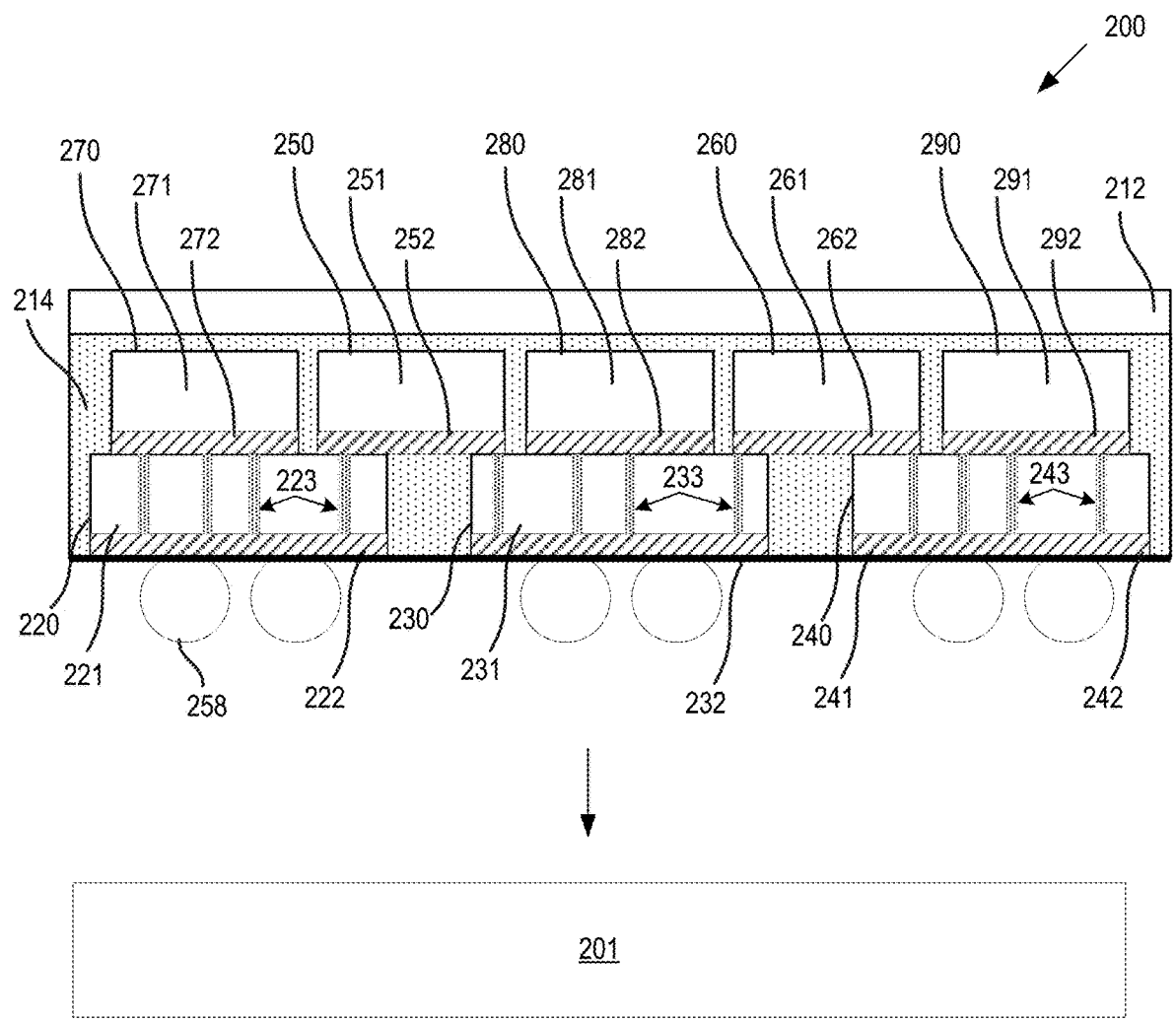
FIG. 2 sets forth a block diagram of an example semiconductor package for creating interconnects between dies using a cross-over die and through-die vias according to some embodiments of the present disclosure.

For further explanation, FIG. 2 depicts a cross section view of an example package structure (200) according to some embodiments. The semiconductor package structure (200) includes multiple primary level dies (220, 230, 240) that serve as the first level of a 3D integrated circuit architecture. In one example, the primary level dies (220, 230, 240) are heterogenous SoC dies that implement a SoC component function. The primary level dies (220, 230, 240) are directly connected to various package interconnects (258) for connecting the semiconductor package to a substrate (201), wafer, card, or other component. The various interconnects (258) provide power and ground to the primary level dies (220, 230, 240) from the substrate and convey input and output signals.

In the example depicted in FIG. 2, each primary level die (220, 230, 240) includes a respective substrate (221, 231, 241). In some examples, each substrate (221, 231, 241) is composed of a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). In these examples, the circuit components may be connected to form integrated circuits that implement a functional circuit block of the SoC die, such as a processor, interface, memory, and or other system component.

In the example depicted in FIG. 2, each primary level die (220, 230, 240) includes a respective connectivity region (222, 232, 242). In some examples, each connectivity region (222, 232, 242) includes build-up layers that include layers of metallization and interlevel dielectric material, as well as conductive structures such as vias, traces, and pads. In these examples, each connectivity region (222, 232, 242) forms the connection between the circuit components composed in each substrate (221, 231, 241) to implement the functional circuit blocks of the SoC die. The connectivity region (222, 232, 242) implements a die-level redistribution layer structure created during the die fabrication process (e.g., a back end of line (BEOL) structure). In the fabrication process, interconnects may be created with very fine line/space pitches of less than 1 μm, thus allowing for high density connections. In these examples, the connectivity region (222, 232, 242) also includes bonding sites to which metal connectors (e.g., die pads, microbumps, Controlled Collapse Chip Connection (C4) bumps) may be attached, either during the fabrication process or in a "post-fab" process such as die packaging. As used herein, each connectivity region (222, 232, 242) represents the "active face" or "front surface" of the die, as opposed to the "back surface" of the die that is a face of the bulk material.

In the example depicted in FIG. 2, each primary level die (220, 230, 240) includes multiple through-silicon via (TSVs) (223, 233, 243) providing interconnection from the connectivity regions (222, 232, 242) through the respective substrates (221, 231, 241) to a back surface of the die, such that the TSVs (223, 233, 243) provide signals (and power and ground) between the connectivity regions (222, 232, 242) on one face of a die to an opposing face of the die for interconnection to another component. In some examples, the respective back surfaces of each primary level die (220, 230, 240) may include a redistribution layer (not shown) that includes a metallization layer or multiple levels of metallization and dielectric layers that is created on the back surface of the die for connecting the TSVs (223, 233, 243) to another component. In some examples, the TSVs (223, 233, 243) may be "via-first" TSVs that are fabricated before device layers (transistors, capacitors, resistors, etc.) are patterned. In some examples, the TSVs (223, 233, 243) may be "via-middle" TSVs that are fabricated after the individual devices are patterned but before the connectivity regions (222, 232, 242) are created. In some examples, the TSVs (223, 233, 243) may be "via-last" TSVs that are fabricated after (or during) the fabrication of the connectivity regions (222, 232, 242). After formation, the TSVs (223, 233, 243) may be selectively filled or plated with conductive material (e.g., copper) to create interconnects. In some examples, the TSVs (223, 233, 243) are essentially metal insulator semiconductor (MIS) devices in which a dielectric layer SiO2 is deposited for the electrical isolation between the conducting metal and silicon substrate. In some examples, the diameter of the TSVs (223, 233, 243) may be less than 10 μm. In some examples, the TSVs (223, 233, 243) are buried, such that the bulk of the substrate must be ground or etched away to expose the TSV. Readers will appreciate that the TSVs (223, 233, 243) provide high density, short channel, wide interconnects useful for die partitioning and die stacking. Readers will also appreciate that, although commonly referred to a "through-silicon" via, a TSV may be any via that connects the front surface of the die to the back surface regardless of the material of the substrate (i.e., a through-die via).

In the example depicted in FIG. 2, the semiconductor package structure (200) also includes secondary level dies (250, 260, 270, 280, 290) that serve as the second level of a 3D integrated circuit architecture. In some examples, as shown in FIG. 2, the secondary level dies (250, 260, 270, 280, 290) are face-to-back (F2B) bonded to the primary level dies (220, 230, 240) through various bonding techniques such as hybrid bonding, thermocompression bonding, solder reflow, and other techniques. However, it is further contemplated that the secondary level dies (250, 260, 270, 280, 290) may be face-to-face (F2F) bonded to the primary level dies (220, 230, 240) through various bonding techniques such as hybrid bonding, thermocompression bonding, solder reflow, and other techniques In some examples, the secondary level dies (250, 260, 270, 280, 290) include interconnect dies (250, 260). In the example depicted in FIG. 2, the interconnect die (250) provides multiple connection pathways between the connectivity region (222) of the die (220), through the TSVs (223), and the connectivity region (232) of the die (230), through the TSVs (233). Likewise, the interconnect die (260) provides multiple connection pathways between the connectivity region (232) of the die (230), through the TSVs (233), and the connectivity region (242) of the die (240), through the TSVs (243). In some examples the connection pathways provided by the interconnect dies (250, 260) are implemented in the conductive structures (metallization layers) of the connectivity regions (252, 262) of the interconnect dies (250, 260). The connectivity regions (252, 262) may be fabricated as described above with respect to the fabrication of connectivity regions (222, 232, 242); thus, connectivity regions (252, 262) may be die-level BEOL structures.

In some embodiments, the interconnect dies (250, 260) are inactive bridge dies, in that they include metallization layers and dielectric layers in the connectivity regions (252, 262) but do not include active device layers that implement logic functions. The connectivity regions (252, 262) are configured to create interconnections between the TSV interfaces on the back surfaces of the primary level dies (220, 230, 240). For example, the connectivity regions (252, 262) may be etched or modified to create connection pathways.

In some embodiments, the interconnect dies (250, 260) are active bridge dies, in that they include metallization layers and dielectric layers in the connectivity regions (252, 262) as well as logic for routing connections between the respectively coupled primary level dies (220, 230, 240). The connectivity regions (252, 262) are configured to create interconnections between the TSV interfaces on the back surfaces of the primary level dies (220, 230, 240). For example, the connectivity regions (252, 262) may be etched or modified to create connection pathways.

In some embodiments, the interconnect dies (250, 260) are SoC dies like the primary level dies (220, 230, 240), in that they include metallization layers and dielectric layers in the connectivity regions (252, 262) as well as functional circuit blocks in the substrate (251, 261) for implementing an SoC component. In other words, in this embodiment, the interconnect dies (250, 260) are essentially SoC dies like the primary level dies (220, 230, 240), but are additionally configured with redistribution layer structures and/or logic for creating interconnections between the TSV interfaces on the back surfaces of the primary level dies (220, 230, 240). For example, the connectivity regions (252, 262) may be etched to create connection pathways.

Readers will appreciate that the use of fabricated die-level redistribution layer structures, such as BEOL structures, in the connectivity regions (252, 262) of the interconnecting dies (250, 260) provides finer line and space pitch and more redistribution layers than is typically achieved in a post-fabrication redistribution layer structure created to connect two dies, thus allowing for greater connection density. Readers will also appreciate that the use of TSVs (223, 233, 243) provides a shorter channel and wider connection than is typically achieved in a post-fabrication redistribution layer structure created to connect two dies. As such, embodiments in accordance with the present disclosure are conducive to high density, short channel, wide interconnection requirements of SoC partitioning into multiple dies.

In the example depicted in FIG. 2, the secondary level dies (250, 260, 270, 280, 290) also include stacked dies (270, 280, 290). In some examples, the stacked dies (270, 280, 290) are SoC dies like the primary level dies (220, 230, 240), in that they include metallization layers and dielectric layers in the connectivity regions (272, 282, 292) as well as functional logic in the substrates (271, 281, 291) for implementing an SoC component. That is, the stacked dies (270, 280, 290) are fabricated in the same manner as described above with respect to the primary level dies (220, 230, 240). Particularly, the connectivity regions (272, 282, 292) include die-level fabricated redistribution layer structures such a BEOL structures. The stacked dies (270, 280, 290) are different from the primary level dies (220, 230, 240) in that they are not directly connected to the package interconnects (258) that convey input signals, output signals, power, and ground; rather, input signals, output signals, power, and ground to/from the stacked dies (270, 280, 290) are conveyed through the TSVs (223, 233, 243) of the primary level dies (220, 230, 240). In some examples, die pads of the stacked dies (270, 280, 290) may be directly bonded to the TSVs (223, 233, 243) or may be bonded to redistribution layer structures constructed on the back surfaces of the primary levels dies for connection to the TSVs (223, 233, 243). Readers will appreciate that the TSVs (223, 233, 243) allow dies to be interconnected through stacking, without the need for a wafer or interposer redistribution layer to connect the dies. Readers will also appreciate that, the F2B stacking and bonding of dies is scalable, in that more than two dies may be stacked. As such, embodiments in accordance with the present disclosure are conducive to smaller package footprints with increased die density within the package.

In the example depicted in FIG. 2, the semiconductor package structure (200) also includes an encapsulant layer (214) encasing the dies (220, 230, 240, 250, 260, 270, 280, 290). In one example, the encapsulating layer (214) is an epoxy or other polymer material. In another example, the encapsulating layer is $SiOx_2$, thus having a coefficient of thermal expansion (CTE) that is closer to that of the dies.

In the example depicted in FIG. 2, the semiconductor package structure (200) also includes a carrier wafer (212) (e.g., composed of silicon) that provides mechanical support to the semiconductor package structure and may provide a surface for attaching a thermal dissipation device such as a heat sink. It will be appreciated that the carrier wafer (212) may be omitted in some embodiments where the encapsulant layer (214) provides sufficient mechanical support to the semiconductor package structure (200).

For further explanation, FIGS. 3A-D set forth an exemplary process flow for constructing a semiconductor package structure (300) according to various embodiments. For example, the exemplary process flow set forth in FIGS. 3A-D may be used to construct the example semiconductor package structure (200) depicted in FIG. 2. Beginning with FIG. 3A, at step 310, primary level dies (320, 330, 420, 430) are attached to a carrier (496), such that the connectivity regions (322, 332, 422, 432) are face-down on the carrier (496) and the back surfaces of the substrates (321, 331, 421, 431) of the dies are face-up. Prior to attaching the dies (320, 330, 420, 430), the attachment surface of the carrier (496) may be treated with a heat or light-activated release layer for eventual detachment of the carrier (496). The carrier (496) may be a glass carrier or other suitable material. In some examples, gaps between the primary level dies (320, 330, 420, 430) are filled with an encapsulating layer as discussed above. In one example process, the primary level dies (320, 330, 420, 430) undergo a thinning process to remove (e.g., by grinding) bulk material from the back surface of the dies to expose buried TSVs (323, 333, 423, 433). Alternatively, thinning is not required or has been performed prior to disposing the primary level dies (320, 330, 420, 430) on the carrier (496). In some examples, the TSVs (323, 333, 423, 433) are plated or filled with a conductive material (e.g., copper), and the back surfaces of the primary level dies (320, 330, 420, 430) are prepared to receive the secondary level dies (350, 370, 380, 450, 470, 480). For example, the back surfaces of the primary level dies (320, 330, 420, 430) may be treated with a metallization layer or redistribution layer structures (metallization and dielectric layers) to facilitate connection of the TSVs (323, 333, 423, 433) to die pads in the connectivity regions (352, 372, 382, 452, 472, 482) of the secondary level dies (350, 370, 380, 450, 470, 480).

Figure 3A:
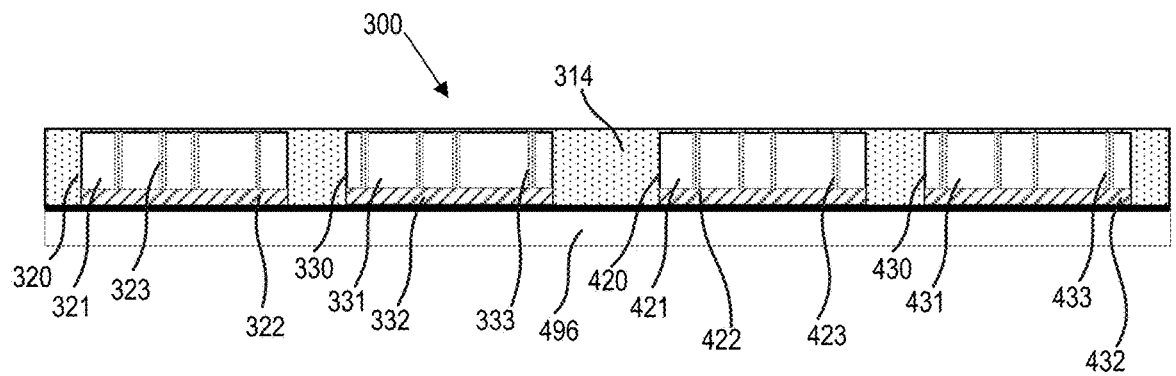
FIG. 3A is a portion of an example process flow for creating interconnects between dies using a cross-over die and through-die vias according to some embodiments.
Figure 3B:
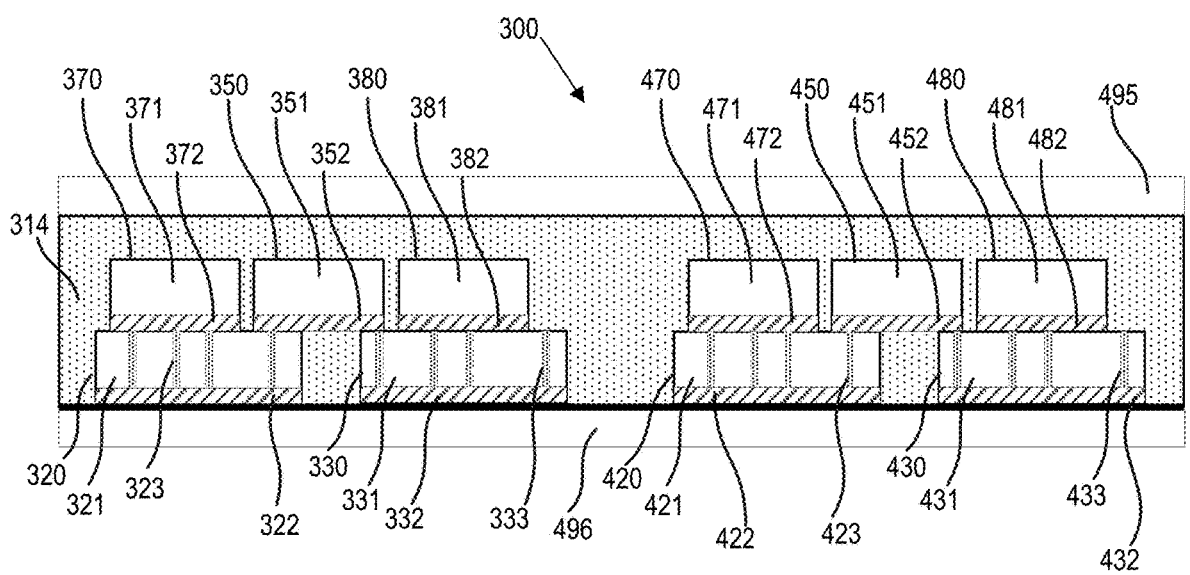
FIG. 3B is a portion of an example process flow for creating interconnects between dies using a cross-over die and through-die vias according to some embodiments.

Moving to FIG. 3B, at step 320, the secondary level dies (350, 370, 380, 450, 470, 480) are F2B bonded to the primary level dies (320, 330, 420, 430). The secondary level dies (350, 370, 380, 450, 470, 480) may be bonded to the primary level dies (320, 330, 420, 430) using various die-bonding techniques. In some examples, die pads in the connectivity regions (352, 372, 382, 452, 472, 482) of the secondary level dies (350, 370, 380, 450, 470, 480) are bonded to exposed TSVs (323, 333, 423, 433) on the back surface of the bonding, primary level dies (320, 330, 420, 430) utilizing a hybrid bonding technique. For example, the interconnecting die (350) includes die pads or microbumps (e.g., for input/output signals, power, and ground for the die) that are bonded or otherwise connected to TSVs (323) of the SoC primary level die (320) and die pads that are bonded to the TSVs (333) of the SoC primary level die (330). Further, the interconnecting die (450) includes die pads or microbumps that are bonded to TSVs (423) of the SoC primary level die (420) and die pads that are bonded to the TSVs (433) of the SoC primary level die (430). In some examples, when present, stacked dies (370, 380, 470, 480) are bonded or otherwise connected to the respective TSVs (323, 333, 423, 433) of their respective host dies (320, 330, 420, 430). For example, the stacked dies (370, 380, 470, 480) may be SoC dies that implement an SoC function or interface, or memory devices. Continuing step 320, additional encapsulant material (314) is added to fill in gaps between the secondary level dies (350, 370, 380, 450, 470, 480) and encapsulate the die substrates (351, 371, 381, 451, 471, 481), and a carrier (495) is added on top of the encapsulant layer (314) for mechanical support and thermal dissipation.

As previously discussed, the interconnecting dies (350, 450) include fabricated die-level redistribution layer structures that implement high density interconnects between primary die (320) and primary die (330) and between primary level die (420) and primary level die (430), respectively. Accordingly, the TSVs (323, 333, 423, 433) and interconnecting dies (350, 450) form high density, short range connection pathways for inter-die communication In some implementations, as previously discussed, the interconnecting die may be an additional SoC die implementing a SoC function, or the interconnecting die may be a passive die solely for the purpose of forming connection pathways. Readers will appreciate that the interconnecting die and stacked die architecture with TSVs described above increases the number of SoC dies that are included in a semiconductor package without increasing the footprint of the package to accommodate fan out redistribution structures, interposers, or wafers for die-to-die connections.

Figure 3C:
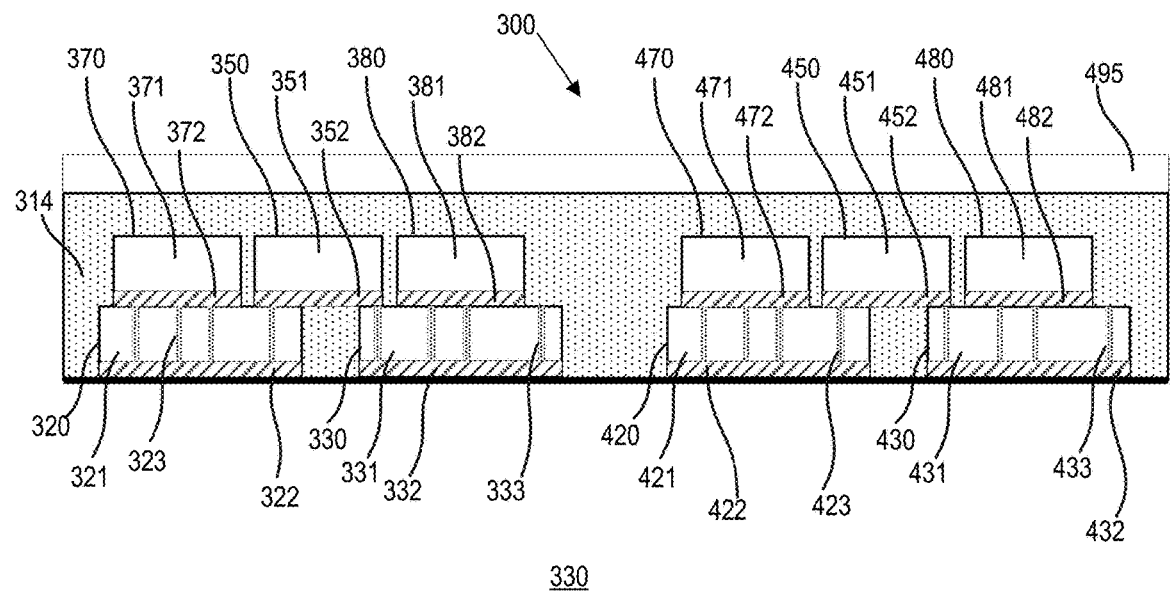
FIG. 3C is a portion of an example process flow for creating interconnects between dies using a cross-over die and through-die vias according to some embodiments.

Moving to FIG. 3C, at step 330, the bottom carrier (496) is detached and the front surfaces of the primary level dies (320, 330, 420, 430), which are then prepared for interconnect attachment. In some examples, the bottom carrier (496) is detached by activating a release layer between the front surfaces of the primary level dies (320, 330, 420, 430) and the carrier (496). For example, the release layer may be activated through heat or light. In some examples the front surfaces of the primary level dies (320, 330, 420, 430) are prepared for interconnect attachment by exposing the bonding sites in the connectivity regions (322, 332, 422, 432) and performing an underbump metallization process.

Figure 3D:
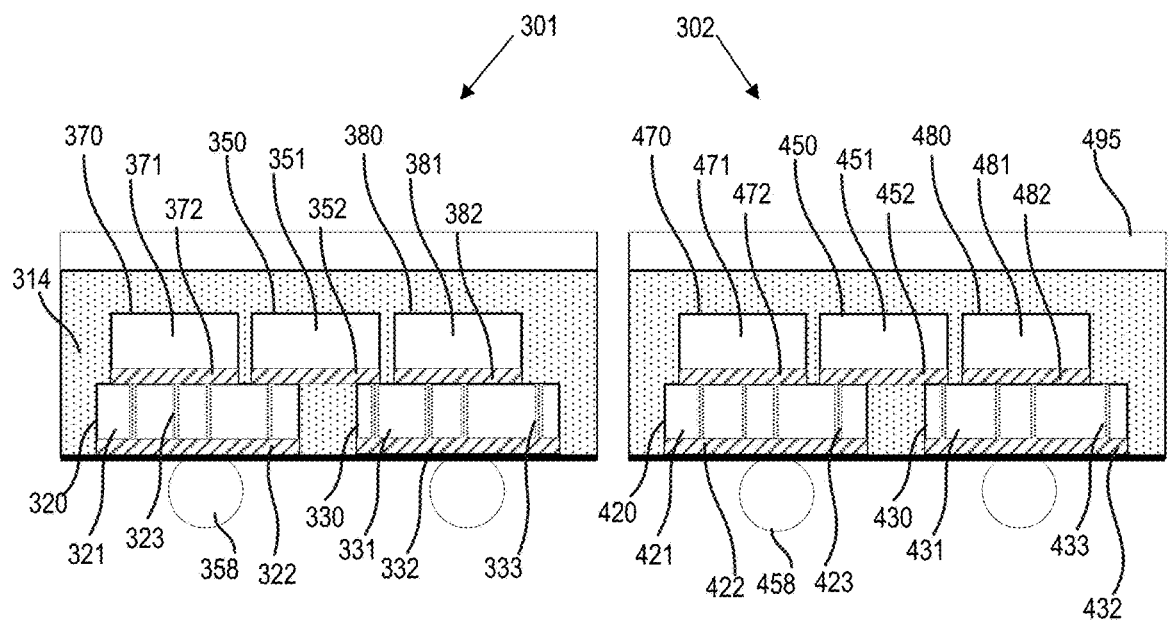
FIG. 3D is a portion of an example process flow for creating interconnects between dies using a cross-over die and through-die vias according to some embodiments.

Moving to FIG. 3D, at step 340, interconnects (358, 458) are attached to the bonding sites of the connectivity regions (322, 332, 422, 432) and the semiconductor package structure (300) is diced to create semiconductor package (301) and semiconductor package (302).

Figure 4:
FIG. 4 is a flowchart of an example method of creating interconnects between dies using a cross-over die and through-die vias according to some embodiments.

For further explanation, FIG. 4 sets forth a flow chart illustrating an example method for creating interconnects between dies using a cross-over die and through-die vias that includes stacking (510) an interconnect die face-down on respective back surfaces of a first die and a second die. In some examples, stacking (510) an interconnect die face-down on respective back surfaces of a first die and a second die is carried out by orienting a first die and a second die face-down on a carrier or other suitable support structure, and placing an interconnect die face-down on the first die and the second die such that the interconnect die partially overlaps a back surface of the first die and partially overlaps a back surface of the second die. As used here, the "face" of a die is the surface of the die proximate the connectivity region, including die-level redistribution layer structures, and device layers. As used here, the "back" of a die is the surface of the die opposite the face and proximate to the inactive bulk material of the die. An example of stacking (510) an interconnect die face-down on respective back surfaces of a first die and a second die is depicted in FIGS. 3A and 3B. The first die and the second dies may be primary level dies such as any of the primary level dies (220, 230, 240, 320, 340, 420, 440) described above that include a functional circuit block of the SoC. The interconnect die may be an interconnect die such as any of interconnect dies (250, 260, 350, 450) described above. As described above, the interconnect die may be an SoC die that implements a functional circuit block of the SoC or may be an active or passive bridge die used only to implement the connection pathways between the first die and the second die.

The example method of FIG. 4 also includes bonding (520) the interconnect die to a first plurality of through-die vias (e.g., TSVs) in the first die and a second plurality of through-die vias (e.g., TSVs) in the second die. In some examples, bonding (520) the interconnect die to a first plurality of through-die vias in the first die and a second plurality of through-die vias in the second die is carried out through a die bonding process in which a first plurality of die pads of the interconnect die is bonded to the first plurality of through-die vias and a second plurality of die pads of the interconnect die is bonded to the second plurality of die pads. In some examples, the die pads are metal interconnect structures (e.g., copper) with a pitch of less than 10 μm and the first plurality of through-die vias and the second plurality of through-die vias have a diameter of less than 10 μm. In these examples, the die pads of the interconnect die may be bonded to the first and second plurality of through-die vias using a hybrid bonding technique, for example, including a metal bond and an oxide bond. The use of the fine pitch interconnects in the interconnect die, available through hybrid bonding, allows for improved signal quality between the first die and the second die through connection pathways implemented by the interconnect die, improved power efficiency, and overall improved performance. In other examples, the bonding (520) the interconnect die to a first plurality of through-die vias in the first die and a second plurality of through-die vias in the second die is carried out by thermocompression bonding, solder reflow, or other well-known die bonding techniques. As described above the through-die vias, such as any of the TSVs described above, provide a connection between the active face of the die and the back surface of the die. In conjunction with the interconnect die, the through-die vias provide a communication pathway to communicatively couple the first die and the second die.

For further explanation, FIG. 5 sets forth a flow chart illustrating an example method for creating interconnects between dies using a cross-over die and through-die vias. Like the example method of FIG. 4, the method of FIG. 5 also includes stacking (510) an interconnect die face-down on respective back surfaces of a first die and a second die and bonding (520) the interconnect die to a first plurality of through-die vias in the first die and a second plurality of through-die vias in the second die. The method of FIG. 5 differs from the method of FIG. 4 in that the method of FIG. 5 also includes, prior to stacking the interconnect die, removing (610) a portion of the back of the first die and the second die to expose the first plurality of through-die vias and the second plurality of through-die vias. In some examples, removing (610) a portion of the back of the first die and the second die to expose the first plurality of through-die vias and the second plurality of through-die vias is carried out by grinding or otherwise removing a portion of the bulk material on the back of the first die and the second die to expose buried through-die vias created in the die during die fabrication.

For further explanation, FIG. 6 sets forth a flow chart illustrating an example method for creating interconnects between dies using a cross-over die and through-die vias. Like the example method of FIG. 4, the method of FIG. 6 also includes stacking (510) an interconnect die face-down on respective back surfaces of a first die and a second die and bonding (520) the interconnect die to a first plurality of through-die vias in the first die and a second plurality of through-die vias in the second die. The method of FIG. 6 differs from the method of FIG. 4 in that the method of FIG. 6 also includes stacking (710) a third die face-down on the back surface of the first die. In some examples, stacking (710) a third die face-down on the back surface of the first die is carried out by aligning die pads in the connectivity region of the third die with a plurality of through-die vias exposed on the back surface of the first die. For example, the third die includes a functional circuit block of the SoC.

The method of FIG. 6 also differs from the method of FIG. 4 in that the method of FIG. 6 also includes bonding (720) the third die to a third plurality of through-die vias in the first die. In some examples, bonding (720) the third die to a third plurality of through-die vias in the first die is carried out by a die-bonding technique where metal interconnects (e.g., die pads) on the connectivity region of the third die are bonded to through-die vias (e.g., TSVs) of the first die, thus implementing a communication pathway between the connectivity region of the first die and the connectivity region of the third die, thereby effecting a redistribution structure communicatively coupling the first die and the third die. Various die-bonding techniques described above may be utilized.

In view of the explanations set forth above, readers will appreciate that creating interconnects between dies using a cross-over die and through-die vias provides integration of heterogenous dies composing a system-on-chip in a package. Readers will also appreciate that the redistribution mechanism coupling two dies using through-die vias and an interconnecting die provides high density, short channel, wide interconnection of the first die and the second die. Readers will also appreciate that the use of the fabricated die-level redistribution structure of the interconnecting die provides finer pitch, higher density interconnection than would be provided by a post-fabrication fan out redistribution structure. Readers will also appreciate that redistribution mechanism coupling two dies using through-die vias and an interconnecting die can be scaled down and are not limited by bump size or pick and place accuracy.

Embodiments discussed herein may be discussed in a specific context, namely packages have a 3D structuring include stacked dies on top of first level dies in a face-to-back orientation and interconnected by bridging die interconnects and through-die vias. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A semiconductor package comprising:
   a first die;
   a second die; and
   an interconnect die coupled to a first plurality of through-die vias in the first die and a second plurality of through-die vias in the second die, wherein the interconnect die:
      includes a connectivity region that implements communication pathways between the first die and the second die;
      is coupled to a surface of the first die through a hybrid bond including a metal bond and an oxide bond, the surface of the first die opposite to another surface of the first die, the another surface of the first die coupled to a substrate; and
      is coupled to a surface of the second die through an additional hybrid bond including the metal bond and the oxide bond, the surface of the second die that is opposite to another surface of the second die, the another surface of the second die coupled to the substrate.

2. The semiconductor package of claim 1, wherein the first die includes a first die pad region on a first surface of a first substrate, the first plurality of through-die vias connecting the first die pad region to a second surface of the first substrate; and
   wherein the second die includes a second die pad region on first a surface of a second substrate, the second plurality of through-die vias connecting the second die pad region to a second surface of the second substrate.

3. The semiconductor package of claim 2, wherein a first plurality of die pads of the interconnect die is connected to the first plurality of through-die vias and a second plurality of die pads of the interconnect die is connected to the second plurality of through-die vias.

4. The semiconductor package of claim 1, wherein the first die, the second die, and the interconnect die are system-on-a-chip dies.

5. The semiconductor package of claim 1, wherein the connectivity region comprises fabricated die-level redistribution layer structures that implement communication pathways between the first die and the second die.

6. The semiconductor package of claim 1, wherein a third die is coupled to the first die using third plurality of through-die vias in the first die; and
wherein a fourth die is coupled to the second die using a fourth plurality of through-silicon vias in the second die.

7. The semiconductor package of claim 5, wherein the fabricated die-level redistribution layer structures comprise back end of line (BEOL) structures.

8. An apparatus comprising:
a component; and
a semiconductor package operatively connected to the component, the semiconductor package comprising:
a first die;
a second die; and
an interconnect die coupled to a first plurality of through-die vias in the first die and a second plurality of through-die vias in the second die, wherein the interconnect die:
includes a connectivity region that implements communication pathways between the first die and the second die;
is coupled to a surface of the first die through a hybrid bond including a metal bond and an oxide bond, the surface of the first die opposite to another surface of the first die, the another surface of the first die coupled to a substrate; and
is coupled to a surface of the second die through an additional hybrid bond including the metal bond and the oxide bond, the surface of the second die opposite to another surface of the second die that is coupled to the substrate.

9. The apparatus of claim 8, wherein the first die includes a first die pad region on a first surface of a first substrate, the first plurality of through-die vias connecting the first die pad region to a second surface of the first substrate; and
wherein the second die includes a second die pad region on first a surface of a second substrate, the second plurality of through-die vias connecting the second die pad region to a second surface of the second substrate.

10. The apparatus of claim 9, wherein a first plurality of die pads of the interconnect die is connected to the first plurality of through-die vias and a second plurality of die pads of the interconnect die is connected to the second plurality of through-die vias.

11. The apparatus of claim 8, wherein the first die, the second die, and the interconnect die are system-on-a-chip dies.

12. The apparatus of claim 8, wherein the connectivity region comprises fabricated die-level redistribution layer structures that implement communication pathways between the first die and the second die.

13. The apparatus of claim 8, wherein a third die is coupled to the first die using a third plurality of through-die vias in the first die; and
wherein a fourth die is coupled to the second die using a fourth plurality of through-silicon vias in the second die.

14. The apparatus of claim 12, wherein the fabricated die-level redistribution layer structures comprise back end of line (BEOL) structures.

15. A method of creating interconnects between dies using a cross-over die and through-die vias, the method comprising:
stacking an interconnect die face-down on respective back surfaces of a first die and a second die, wherein: the back surface of the first die is opposite to another surface of the first die, the another surface of the first die coupled to a substrate; and the back surface of the second die is opposite to another surface of the second die, the another surface of the second die coupled to the substrate; and
bonding the interconnect die to a first plurality of through-die vias in the first die and to a second plurality of through-die vias in the second die using a hybrid bond including a metal bond and an oxide bond, wherein the interconnect die includes a connectivity region that implements communication pathways between the first die and the second die.

16. The method of claim 15, further comprising, prior to stacking the interconnect die, removing a portion of the back of the first die and the second die to expose the first plurality of through-die vias and the second plurality of through-die vias.

17. The method of claim 15, wherein stacking an interconnect die face-down on respective back surfaces of the first die and the second die includes aligning a first plurality of die pads of the interconnect die for connection to the first plurality of through-die vias and a second plurality of die pads of the interconnect die for connection to the second plurality of die pads.

18. The method of claim 15, further comprising:
stacking a third die face-down on the back surface of the first die; and
bonding the third die to a third plurality of through-die vias in the first die.

19. The method of claim 15, wherein the first die, the second die, and the interconnect die are system-on-a-chip dies.

20. The method of claim 15, wherein the connectivity region comprises fabricated die-level redistribution layer structures that implement communication pathways between the first die and the second die.

* * * * *